(12) United States Patent
Chen et al.

(10) Patent No.: US 8,219,896 B2
(45) Date of Patent: Jul. 10, 2012

(54) REDUCED-COMPLEXITY DECODING ALGORITHMS FOR TAIL-BITING CONVOLUTIONAL CODES

(75) Inventors: Jason Chen, Älvsjö (SE); Shiau-He Shawn Tsai, Stockholm (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 970 days.

(21) Appl. No.: 12/140,956

(22) Filed: Jun. 17, 2008

(65) Prior Publication Data

US 2009/0103659 A1 Apr. 23, 2009

Related U.S. Application Data

(60) Provisional application No. 60/982,112, filed on Oct. 23, 2007.

(51) Int. Cl.
*H03M 13/03* (2006.01)
(52) U.S. Cl. .......................................................... 714/795
(58) Field of Classification Search .................. 714/795
See application file for complete search history.

(56) References Cited

U.S. PATENT DOCUMENTS

| | | | |
|---|---|---|---|
| 4,747,104 A | 5/1988 | Piret | |
| 6,347,122 B1 | 2/2002 | Chen et al. | |
| 7,197,685 B2 | 3/2007 | Limberg | |
| 7,606,336 B2 * | 10/2009 | Lee et al. | 375/341 |
| 7,853,859 B2 | 12/2010 | Ojard | |
| 7,983,363 B2 * | 7/2011 | Jayaraman et al. | 375/341 |
| 2003/0033565 A1 | 2/2003 | Crozier et al. | |
| 2007/0033509 A1 | 2/2007 | Gupta | |
| 2007/0089043 A1 * | 4/2007 | Chae et al. | 714/795 |
| 2007/0174757 A1 * | 7/2007 | Gho et al. | 714/795 |
| 2007/0245209 A1 * | 10/2007 | Shi et al. | 714/755 |
| 2009/0070658 A1 * | 3/2009 | Patapoutian et al. | 714/795 |
| 2009/0150755 A1 | 6/2009 | Chen et al. | |
| 2010/0169747 A1 | 7/2010 | Chen et al. | |
| 2011/0060972 A1 * | 3/2011 | Shi et al. | 714/795 |

FOREIGN PATENT DOCUMENTS

WO 2009/058087 A1 5/2009

OTHER PUBLICATIONS

Ma et al., "On tail biting convolutional codes," IEEE Trans. Commun., vol. 34, pp. 104-111, Feb. 1986.

Mzyece et al, "Performance evaluation of suboptimal decoding schemes for tail biting convolutional codes in EDGE headers," IEE Electronics Letters, vol. 39, No. 17, pp. 1280-1281, Aug. 2003.

Cox et al, "An efficient adaptive circular viterbi algorithm for decoding generalized tailbiting convolutional codes," IEEE Trans. Veh. Technol., vol. 43, pp. 57-68, Feb. 1994.

(Continued)

*Primary Examiner* — Robert Beausoliel, Jr.
*Assistant Examiner* — Neil Miles
(74) *Attorney, Agent, or Firm* — Nixon & Vanderhye, P.C.

(57) ABSTRACT

A decoder is provided which is configured to operate upon an input encoded sequence using a wrap around Viterbi procedure, and a decoding method which employs the decoder. The decoder/method is configured to output a selected path as a decode sequence, and to avoid storing, for a current iteration of the wrap-around Viterbi procedure other than a first iteration, a best path up to the current iteration.

17 Claims, 9 Drawing Sheets

OTHER PUBLICATIONS

Berrou et al, "Multiple parallel concatenation of circular recursive convolutional (CRSC) codes," Annals of Telecommunications, vol. 54, No. 3-4, pp. 166-172, Mar.-Apr. 1999.

Wang et al, "On MAP decoding for tail-biting convolutional codes," IEEE International Symposium on Information Theory (ISIT) 1997, pp. 225, Jun. 1997.

Ståhl et al, "Optimal and near-optimal encoders for short and moderate-length tail-biting trellises," IEEE Trans. Inform. Theory, vol. 45, pp. 2562-2571, Nov. 1999.

Shao et al, "Two decoding algorithms for tail-biting codes," IEEE Trans. Commun., vol. 51, No. 10, pp. 1658-1665, Oct. 2003.

Bahl et al, "Optimal decoding of linear codes for minimizing symbol error rate," IEEE Trans. Inform. Theory, vol. 20, pp. 284-287, Mar. 1974.

Anderson et al, "Tailbiting MAP decoders," IEEE J. Select. Areas Commun., vol. 16, pp. 297-302, Feb. 1998.

Chen et al, "Final report on 2005 WiMAX link simulation," 05/0363-6/FCP 101 3630 Uen, Ericsson Internal Technical Document, Mar. 2006.

Danashgaran, "Linear Subcodes of Turbo Codes with Improved Distance Spectra", 2004, IEEE, vol. 50, pp. 3291-3294.

U.S. Office Action mailed Mar. 5, 2012 in U.S. Appl. No. 12/696,141.

International Preliminary Report on Patentability mailed Jun. 9, 2011 in PCT Application No. PCT/SE2009/051326.

International Search Report mailed Dec. 23, 2010 in PCT Application PCT/SE2009/051326.

Larsen, "Short convolutional codes with maximal free distance for rate 1/2, 1/3, and 1/4," IEEE Trans. Inform. Theory, vol. 19, pp. 371-372, May 1973.

Chang et al, "Some extended results on the search for good convolutional codes," IEEE Trans. Inform. Theory, vol. 43, pp. 1682-1697, Sep. 1997.

Stahl et al, "A note on tailbiting codes and their feedback encoders," IEEE Trans. Inform. Theory, vol. 48, pp. 529-534, Feb. 2002.

Ould-Cheikh-Mouhamedou et al, "Distance measurement method for double binary turbo codes and a new interleaver design for DVB-RCS," IEEE Globecom 04, pp. 172-178.

IEEE Std 802.16-2004, "IEEE Standard for Local and Metropolitan Area Networks—Part 16: Air Interface for Fixed Broadband Wireless Access Systems", Oct. 2004.

IEEE Std P802.16e-2005, "IEEE Standard for Local and Metropolitan Area Networks—Part 16: Air Interface for Fixed and Mobile Broadband Wireless Access Systems", Feb. 2006.

U.S. Office Action mailed Oct. 13, 2011 in U.S. Appl. No. 12/260,340.

\* cited by examiner

REDUCED-COMPLEXITY DECODING ALGORITHMS FOR TAIL-BITING CONVOLUTIONAL CODES

This application claims the benefit and priority of U.S. provisional patent application 60/982,112, filed Oct. 23, 2007, entitled "REDUCED-COMPLEXITY DECODING ALGORITHMS FOR TAIL-BITING CONVOLUTIONAL CODES", which is incorporated by reference herein in its entirety.

TECHNICAL FIELD

This invention pertains to convolutional coding, and particularly to a decoder and decoding procedure for decoding a tail-biting convolutional code.

BACKGROUND

In many environments data in various forms (e.g., various protocols, modulations, etc.) can be transmitted over a channel from a transmitter to a receiver. Depending on the type and circumstances of operation, some channels are more or less prone or susceptible to loss or degradation of the data being transmitted over the channel, with differing channels having differing degrees of potential loss or corruption. For example, a wireline channel typically has a relatively higher degree of integrity and reliability than a channel existing over a radio or interface.

Detection of loss or inaccurate transmission of data over a channel is possible when certain additional information in the form of an error detection code is added to the data stream. For example, at a receiver a frame or block of data can have appended to it an error detection code in the form of (for example) a check character(s) or check sum which is computed or otherwise derived from the block. Upon reception of the block by the receiver, the receiver can independently recompute or re-derive the error detection code (e.g., the receiver's version of the check character(s) or check sum). If the recomputed or re-derived error detection code (e.g., check sum) is the same as the error detection code included in the received block or frame, the receiver can confirm that the block or frame is correctly decoded.

In addition to error detection techniques, error correcting techniques are also known. For example, error correction codes (generated by polynominals that operate over a frame or block of user data) can also be added to the data stream. Upon reception of the complete frame or block, using the known error correction code/technique the receiver can locate and correct certain errors in the data stream.

A convolutional code is a forward error-correction scheme, whereby the coded sequence is algorithmically achieved through the use of current data bits plus some of the previous data bits from the incoming stream. In telecommunication, a convolutional code is a type of error-correcting code in which (a) each m-bit information symbol (each m-bit string) to be encoded is transformed into an n-bit symbol, where m/n is the code rate ($n \geq m$) and (b) the transformation is a function of the last k information symbols, where k is the constraint length of the code. A trellis description of a convolutional encoder shows how each possible input to the encoder influences both the output and the state transitions of the encoder.

A convolutional code (CC) is called tail-biting (or circular) if the beginning state of its encoding trellis is always equal to the ending state of its encoding trellis after encoding. Tail-biting convolutional codes (TBCC) are simple and powerful forward error correction (FEC) codes, as described, e.g., in H. H. Ma and J. K. Wolf, "On tail biting convolutional codes," IEEE Trans. Commun., vol. 34, pp. 104-111, February 1986.

Tail-biting convolutional codes (TBCC) are employed in many environments, including telecommunication networks having an air, radio, or "wireless" interface. Tail-biting convolutional codes (TBCC) have been adopted as the mandatory channel codes for the data channels and the overhead channels (like frame control header) in 802.16 WiMAX (Worldwide Interoperability for Microwave Access) system. 802.16 WiMAX is described, e.g., in IEEE Std 802.16-2004, "IEEE Standard for Local and Metropolitan Area Networks—Part 16: Air Interface for Fixed Broadband Wireless Access Systems", October, 2004; and IEEE Std P802.16e-2005, "IEEE Standard for Local and Metropolitan Area Networks—Part 16: Air Interface for Fixed and Mobile Broadband Wireless Access Systems", February, 2006, both of which are incorporated herein by reference. They have also been adopted as the channel codes for the header channel in the EDGE system and for the control channel in the IS-54 system. For a description of the EDGE system, see, e.g., M. Mzyece and J. Dunlop, "Performance evaluation of suboptimal decoding schemes for tail biting convolutional codes in EDGE headers," IEE Electronics Letters, vol. 39, no. 17, pp. 1280-1281, August 2003, incorporated herein by reference. For a description of the IS-54 system, see, e.g., R. V. Cox and C.-E. W. Sundberg, "An efficient adaptive circular viterbi algorithm for decoding generalized tailbiting convolutional codes," IEEE Trans. Veh. Technol., vol. 43, pp. 57-68, February 1994, incorporated herein by reference.

As indicated above, a convolutional code (CC) is called tail-biting (or circular) if the beginning state of its encoding trellis is always equal to the ending state of its encoding trellis after encoding. For a feedforward CC, the beginning state is simply determined by the last v input bits, where v is the overall constraint length. See, e.g., H. H. Ma and J. K. Wolf, "On tail biting convolutional codes," IEEE Trans. Commun., vol. 34, pp. 104-111, February 1986. Johannesson and K. S. Zigangirov, Fundamentals of convolutional coding. Piscataway, N.J.: IEEE Press, 1999; S. Lin and D. J. Costello, Jr, Error control coding. Upper Saddle River, N.J.: Pearson, 2004; all incorporated herein by reference. For a feedback CC, the encoder structure has to comply with certain conditions so that the circular encoding is possible. See, e.g., C. Berrou, C. Douillard and M. Jezequel, "Multiple parallel concatenation of circular recursive convolutional (CRSC) codes," Annals of Telecommunications, vol. 54, No 3-4, pp. 166-172, March-April 1999; and Y.-P. Wang, R. Ramesh, A. Hassan, and H. Koorapaty, "On MAP decoding for tail-biting convolutional codes," IEEE International Symposium on Information Theory (ISIT) 1997, pp. 225, June 1997; both incorporated herein by reference.

In both cases (feedforward and feedback CC) the beginning state (also called the circular state) of the encoding trellis is determined from the input information bit vector. That is, the beginning state is not always equal to the all-zero state and depends on the values of the input bits. However, the information on the circular state is not available to the receiver. Therefore one important task in the decoder for decoding TBCC is to estimate the circular state based on the received soft bit metrics.

There are many advantages of using a Tail-biting convolutional code (TBCC) over the conventional zero-tail convolutional codes (ZTCC) and some block codes. Among the advantages are the following:

1. A zero-tail convolutional code (ZTCC) needs to use v redundant zero-tail bits to terminate the encoding trellis to the all-zero state. In a Tail-biting convolutional code (TBCC), zero-tail bits are not needed and they can be replaced by payload bits to increase the spectral efficiency of the channel code.

2. Many good block codes can be generated by equivalent TBCC's (see, e.g., P. Ståhl, J. B. Anderson and R. Johannesson, "Optimal and near-optimal encoders for short and moderate-length tail-biting trellises," IEEE Trans. Inform. Theory, vol. 45, pp. 2562-2571, November 1999, incorporated herein by reference), and hence can be decoded by the more efficient soft-input soft-output decoding algorithms for trellis codes. See, e.g., R. Y. Shao, S. Lin and M. P. C. Fossorier, "Two decoding algorithms for tail-biting codes," IEEE Trans. Commun., vol. 51, no. 10, pp. 1658-1665, October 2003; R. Johannesson and K. S. Zigangirov, Fundamentals of convolutional coding. Piscataway, N.J.: IEEE Press, 1999; S. Lin and D. J. Costello, Jr, Error control coding. Upper Saddle River, N.J.: Pearson, 2004, all incorporated herein by reference.

In order to achieve the superior performance of Tail-biting convolutional codes (TBCC), the circular state (or the probability distribution of the beginning states in terms of state metrics) needs to be efficiently and accurately estimated before or jointly with the decoding process. Many efficient algorithms have been proposed for estimating the circular state (or the probability distribution of the beginning states in terms of state metrics) of and decoding a Tail-biting convolutional code (TBCC). These algorithms can roughly be divided into two categories. A first category is the maximum likelihood (ML) Viterbi-type algorithms (See, e.g., R. Y. Shao, S. Lin and M. P. C. Fossorier, "Two decoding algorithms for tail-biting codes," IEEE Trans. Commun., vol. 51, no. 10, pp. 1658-1665, October 2003, incorporated herein by reference). A second category is the maximum a posteriori probability (MAP) BCJR-type algorithms. See, e.g., L. R. Bahl, J. Cocke, F. Jelink, and J. Raviv, "Optimal decoding of linear codes for minimizing symbol error rate," IEEE Trans. Inform. Theory, vol. 20, pp. 284-287, March 1974; and J. B. Anderson and S. M. Hladik, "Tailbiting MAP decoders," IEEE J. Select. Areas Commun., vol. 16, pp. 297-302, February 1998, incorporated herein by reference.

The technology described herein focuses primarily on the low-complexity Viterbi-type algorithms. Among them, the wrap-around Viterbi algorithm (WAVA) provides good compromises between performance and complexity. The low-complexity Viterbi-type algorithms are described, e.g., by R. Y. Shao, S. Lin and M. P. C. Fossorier, "Two decoding algorithms for tail-biting codes," IEEE Trans. Commun., vol. 51, no. 10, pp. 1658-1665, October 2003, incorporated herein by reference. WAVA is briefly summarized below.

The wrap-around Viterbi algorithm (WAVA) is based on the property that the starting and ending states in the trellis of a tail-biting code are the same and therefore the trellis can be viewed as a cylinder by connecting the beginning and ending parts of the trellis together. Then the conventional Viterbi algorithm is conducted over the decoding trellis for several cycles (or iterations) to improve the estimation of the probability distribution of the beginning states (in terms of state metrics). Let $M=2^v$ be the number of states in the trellis, L the length of the trellis (or the number of trellis stages), and let I be the maximum number of cycles (or iterations) allowed in the wrap-around Viterbi algorithm (WAVA). Let $(\rho_{best}^{(i)}, m_{best}^{(i)})$ be the best path and its path metric up to iteration i, and let $(\rho_{TB,best}^{(i)}, m_{TB,best}^{(i)})$ be the best tail-biting path (TBP) and its path metric up to iteration i. As used herein, a best path (whether tail-biting or not) "up to iteration i" means the best path thus far encountered in all iterations including the current iteration i. On the other hand, let $(\sigma_{best}^{(i)}, \tau_{best}^{(i)})$ be the best path and its path metric during iteration i, and let $(\rho_{TB,best}^{(i)}, m_{TB,best}^{(i)})$ be the best tail-biting (TBP) and its path metric during iteration i. A tail-biting path (TBP) here is defined as a decoded path with the same beginning state and ending state. Therefore, it is possible that the decoder can not find $\sigma_{TB,best}^{(1)}$ during iteration i. Note that the state metrics are accumulated from the very first iteration, and are used in the selection of survivor paths in the Viterbi algorithm. However, the selection of the best path and the best tail-biting path (TBP) during each iteration are based on the path metrics, which are equal to ending states' metrics subtracted by the beginning states' metrics during one iteration. During iteration i, if $\tau_{best}^{(i)}$ is larger than $m_{best}^{(i-1)}$, $(\rho_{best}^{(i)}, m_{best}^{(i)})$ will be updated to $(\sigma_{best}^{(i)}, \tau_{best}^{(i)})$; otherwise, $(\rho_{best}^{(i)}, m_{best}^{(i)})$ will be set to the previous values $(\rho_{best}^{(i-1)}, m_{best}^{(i-1)})$. The same rules apply to the update for the best TBP.

The conventional wrap-around Viterbi algorithm (WAVA) can be described by the following sequence of acts or steps:

(act 1) Initialize all the M number of beginning states' metrics to zero so that all beginning states are equally likely.

(act 2) For the first iteration, the conventional Viterbi algorithm is conducted to find the M number of survivor paths at the M number of ending states. If the best path (with the largest path metric) among the M number of survivor paths is a tail-biting path (TBP), then the decoding process is terminated and the decoder outputs the best path as the decoded sequence; otherwise, record $(\rho_{best}^{(1)}, m_{best}^{(1)})$ and $(\rho_{TB,best}^{(1)}, m_{TB,best}^{(1)})$ if the pair exists.

(act 3) At iteration i, i>1, the state metrics for the M number of beginning states are initialized by the state metrics of the M number of final states from iteration (i-1), and the conventional Viterbi algorithm is conducted to find the M number of survivor paths at the M number of ending states. At the end of iteration i, both $(\rho_{best}^{(i)}, m_{best}^{(i)})$ and $(\rho_{TB,best}^{(i)}, m_{TB,best}^{(i)})$ are updated. If $\rho_{TB,best}^{(i)}$ exists and satisfies some termination condition, the decoding process is terminated and the decoder outputs $\rho_{TB,best}^{(i)}$ as the decoded sequence. Otherwise act 4 is performed.

(act 4) Repeat act 3 until either the decoding process is terminated (due to the satisfaction of some termination condition) or the maximum number of iterations I is reached.

(act 5) The decoder outputs $\rho_{best}^{(I)}$ as the decoded sequence if it exists. Otherwise, the decoder outputs $\rho_{best}^{(I)}$ as the decoded sequence.

In act 3 above, two possible termination conditions (or stopping rules) can be used (See, e.g., R. Y. Shao, S. Lin and M. P. C. Fossorier, "Two decoding algorithms for tail-biting codes," IEEE Trans. Commun., vol. 51, no. 10, pp. 1658-1665, October 2003, incorporated herein by reference). The first possible termination condition is called the simple termination condition where $\rho_{TB,best}^{(i)} = \rho_{best}^{(i)}$; that is, the best path up to iteration i is the best tail-biting path (TBP) up to iteration i. The second possible termination condition is called the sufficient termination condition, where the metric of the best tail-biting path (TBP) up to iteration i ($m_{TB,best}^{(i)}$) is compared with some adaptive threshold. The sufficient condition will guarantee that the output tail-biting path (TBP) is the maximum likelihood (ML) solution. The details of the sufficient termination condition can be found in R. Y. Shao, S. Lin and M. P. C. Fossorier, "Two decoding algorithms for tail-biting codes," IEEE Trans. Commun., vol. 51, no. 10, pp. 1658-1665, October 2003, incorporated herein by reference).

In general, the performances with the above two termination conditions are almost identical and are very close to the optimum maximum likelihood (ML) decoding performance. See, e.g., T.-T. Jason Chen, S. Shawn Tsai, "Final report on 2005 WiMAX link simulation," 05/0363-6/FCP101 3630

Uen, Ericsson Internal Technical Document, March 2006, incorporated herein by reference. However, the decoder with the sufficient termination condition requires less average number of iterations (cycles) with the cost of higher complexity (from the computation and storage of thresholds) than the decoder with the simple termination condition.

There are, however, problems with existing solutions. For example, during the iterations in wrap-around Viterbi algorithm (WAVA), both $(\rho_{best}^{(i)}, m_{best}^{(i)})$ and $(\rho_{TB,best}^{(i)}, m_{TB,best}^{(i)})$ need to be stored and updated after each iteration. The storing and updating of the $(\rho_{best}^{(i)}, m_{best}^{(i)})$ and $(\rho_{TB,best}^{(i)}, m_{TB,best}^{(i)})$ values requires more computational complexity and memory usage, especially when the packet length is long or when the average number of iterations (cycles) needed by wrap-around Viterbi algorithm (WAVA) is large (like over the low SNR region). The higher computational complexity and larger memory usage are not desirable, especially in a radio access network application and particularly in a wireless terminal (e.g., on the mobile station terminal side).

SUMMARY

In one of its aspects, the technology described herein concerns a decoder configured to operate upon an input encoded sequence using a wrap around Viterbi procedure, and a decoding method which employs the decoder. The decoder/method is configured to output a selected path as a decode sequence, and to avoid storing, for a current iteration of the wrap-around Viterbi procedure other than a first iteration, a best path up to the current iteration.

The technology described herein capitalizes upon the fact that, during the decoding process using a wrap-around Viterbi algorithm (WAVA), the accuracy of the probability distribution for the beginning states (in terms of metrics) will in general improve from one iteration to the next iteration. As a result, the best path (or the best tail-biting path (TBP)) found during iteration i will very likely be better than the best path (or the best tail-biting path (TBP)) found up to iteration (i-1). Therefore, during iteration i for the wrap-around Viterbi algorithm (WAVA), according to the decoder and decoding methods described herein there is no need to keep track of the best path found up to iteration (i-1), and it is generally sufficient to use the best path and the best tail-biting path (TBP) found during the current iteration i.

The technology described herein comprises new schemes (e.g. new embodiments of decoders and new modes of decoding operation) which improve wrap-around Viterbi algorithm (WAVA) utilization by reducing complexity of algorithm execution. A first scheme is called WAVA1 (first reduced-complexity Wrap-Around Viterbi Algorithm); a second scheme is called WAVA2 (second reduced-complexity Wrap-Around Viterbi Algorithm) As mentioned above, there are two kinds of termination conditions: the simple termination condition and the sufficient termination condition. WAVA1 simple, WAVA1 sufficient, WAVA2 simple, and WAVA2 sufficient are examples of the preferred algorithms for this technology.

In one specific example embodiment and mode ("WAVA1 simple"), the decoder/method is configured for the current iteration: (1) to determine a best path for the current iteration; and (2) to determine and record a best tail-biting path up to the current iteration.

In another specific example embodiment and mode ("WAVA1 sufficient"), the decoder/method is configured, for the current iteration: (1) to determine a best path for the current iteration when the current iteration is the maximum iteration and only when the best tail-biting path up to the maximum iteration does not exist; or (2) to determine and record a best tail-biting path up to the current iteration.

In another specific example embodiment and mode ("WAVA2 sufficient"), the decoder/method is configured to determine, for the current iteration: (1) a best path for the current iteration when the current iteration is the maximum iteration and only when the best tail-biting path for the maximum iteration does not exist; or (2) a best tail-biting path for the current iteration.

In yet another specific example embodiment and mode ("WAVA2 simple"), the decoder/method is configured to determine and store, (1) to determine a best path for the current iteration; and (2) a best tail-biting path for the current iteration when the current iteration is the maximum iteration and only when the best path for the maximum iteration is not a tail-biting path.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. That is, those skilled in the art will be able to devise various arrangements which, although not explicitly described or shown herein, embody the principles of the invention and are included within its spirit and scope. In some instances, detailed descriptions of well-known devices, circuits, and methods are omitted so as not to obscure the description of the present invention with unnecessary detail. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that block diagrams herein can represent conceptual views of illustrative circuitry embodying the principles of the technology. Similarly, it will be appreciated that any flow charts, state transition diagrams, pseudocode, and the like represent various processes which may be substantially represented in computer readable medium and so executed by a computer or processor, whether or not such computer or processor is explicitly shown.

The functions of the various elements including functional blocks labeled or described as "processors" or "controllers" may be provided through the use of dedicated hardware as well as hardware capable of executing software in association with appropriate software. When provided by a processor, the functions may be provided by a single dedicated processor, by a single shared processor, or by a plurality of individual processors, some of which may be shared or distributed. Moreover, explicit use of the term "processor" or "controller" should not be construed to refer exclusively to hardware capable of executing software, and may include, without limitation, digital signal processor (DSP) hardware, read only memory (ROM) for storing software, random access memory (RAM), and non-volatile storage.

Figure 1:
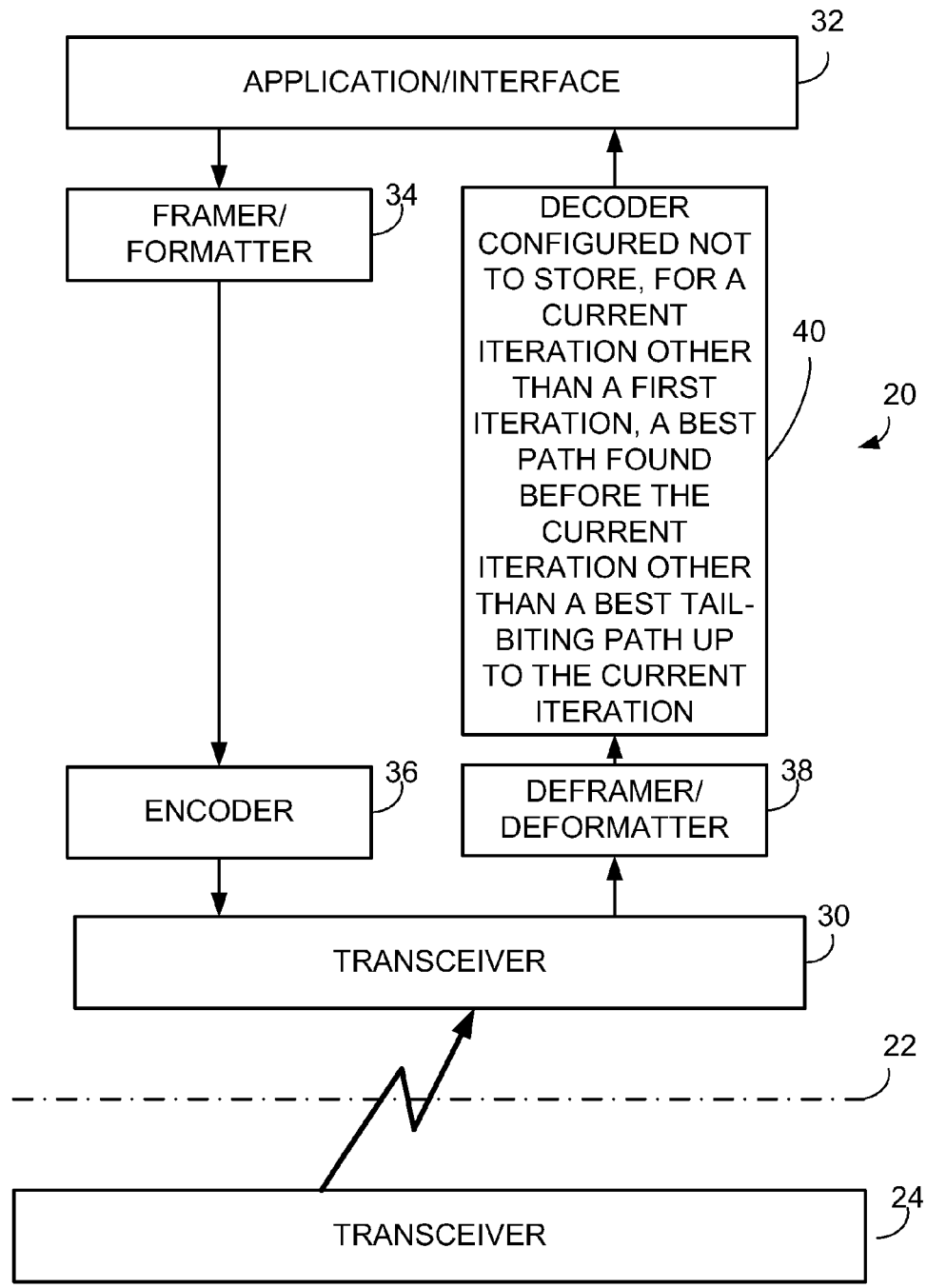
FIG. 1 is a diagrammatic view of a communications node or device that comprises an encoder according to an example embodiment.

FIG. 1 illustrates an example embodiment of a node or a device 20 suitable for use with the present technology. The node or device 20 communicates over an interface 22 with another node or device 24. It so happens, in the illustrated, non-limiting example, node or device 20 and node or device 24 comprise or reside in a radio access network wherein interface 22 is a radio or air interface. In the illustrated example environment of a radio access network, one of node or device 20 and node or device 24 can be a base station node (also known as a radio base station, a NodeB, or eNodeB, among other appellations), and the other a wireless terminal or the like (also known as a mobile terminal, mobile station, or user equipment unit (UE), among other appellations). Example general components or constituent elements of node or device 20 are shown in FIG. 1 in such a manner that node or device 20 can be (in the example environment of a radio access network) either a base station node or a wireless terminal.

FIG. 1 shows the representative node or device 20 as comprising a transceiver 30 by which node or device 20 communicates over interface 22 with the other node or device 24. On a link from node or device 20 to node or device 24 the transceiver 30 obtains data for transmission from application/interface 32. The terminology application/interface 32 is utilized to indicate that the data source for transmission can be either an application (e.g., software or program) executed by node or device 20, or an interface through which node or device 20 receives the data from another upstream node or another device (unillustrated in FIG. 1). FIG. 1 further shows node or device 20 as comprising framer/formatter 34 which assembles the data obtained from the source (e.g., application/interface 32) into a transmission unit such as a frame, block, or the like. Further, node or device 20 comprises encoder 36 which encodes the transmission unit for transmission by transceiver 30 over application/interface 32.

On a receiving side, node or device 20 comprises deframer/deformatter 38 which segments an incoming stream of data (e.g., incoming from the other node or device 24 over interface 22) into transmission units (such as frames, blocks, or the like) which are usable by application/interface 32. The node or device 20 further comprises decoder 40 which decodes a transmission unit obtained by transceiver 30 for use by the data sink, i.e., application/interface 32. With respect to the receiving side of node or device 20, the terminology application/interface 32 is utilized to indicate that the data sink for data received by node or device 20 can be either an application (e.g., software or program) executed by node or device 20, or an interface through which node or device 20 forwards the data from another upstream node or another device (unillustrated in FIG. 1).

A feature of the present technology is decoder 40 and decoding operations performed thereby. Several example embodiments of decoder 40 and differing modes of implementation of decoding procedures are described herein. Before continuing to description of decoder 40 and its method of operation, it is emphasized that illustrative, representative node or device 20 of FIG. 1 typically has other components and constituents, both on the receiving side and on the transmitting side, and elsewhere, and is usually considerably more complex in overall structure and operation than illustrated in FIG. 1 and described herein. However, only selected components and constituents comprising node or device 20 are described in FIG. 1 for sake of providing clearer and unobscured explanation of the present technology. Moreover, it should also be appreciated that the environment of operation of node or device 20 is not limited to a radio access network, and that the node or device 20 can communicate with other node or device 24 over interfaces other than a radio or air interface, such as (as non-limiting examples) a wired interface or an optical interface. Further, in the particular situation in which the environment of operation does happen to be a radio access network, the type of radio access network is not critical, and can comprise, for example, a GSM, UTRAN, EDGE, WiMAX, LTE, or other type of radio access network.

In its various example embodiments and modes, decoder 40 is configured to operate upon an input encoded sequence using a wrap around Viterbi procedure. The decoder 40 is configured to output a selected path as a decode sequence, and to avoid storing, for a current iteration of the wrap-around Viterbi procedure other than a first iteration, a best path up to the current iteration.

The structure and operation of decoder 40 capitalizes upon the fact that, during the decoding process using a wrap-around Viterbi algorithm (WAVA), the accuracy of the probability distribution for the beginning states (in terms of metrics) will in general improve from one iteration to the next iteration. As a result, the best path (or the best tail-biting path (TBP)) found during iteration i is very likely to be better than the best path (or the best tail-biting path (TBP)) found up to iteration (i-1). Therefore, during iteration i for the wrap-around Viterbi algorithm (WAVA), according to the decoder and decoding methods described herein it may not be necessary to keep track of the best path and the best tail-biting path (TBP) found up to iteration (i-1), and it could be sufficient to use the best path and the best tail-biting path (TBP) found during the current iteration i.

The technology described herein uses, by way of non-limiting example, four example embodiments of decoder 40 and a corresponding four modes of decoding. These four embodiments/modes are hereinafter described and/or named as follows: WAVA1 simple; WAVA2 simple; WAVA1 sufficient; and WAVA2 sufficient. As understood from the foregoing, "WAVA" is an abbreviation for wrap-around Viterbi algorithm, and the phrase "wrap-around Viterbi algorithm" is used interchangeably with "wrap-around Viterbi procedure" or "wrap-around Viterbi technique".

Throughout this document and the drawings, if only "WAVA1" or "WAVA2" is indicated, then both simple and sufficient termination conditions should be understood to apply.

Before describing certain specific embodiments and modes, a generic embodiment and mode is described with reference to FIG. 2. It will be appreciated that the example general, representative acts or steps of FIG. 2 reflect a generic method of operation as well as the manner in which a generic decoder 40 can be structured or configured for execution of the present technology.

Figure 2:
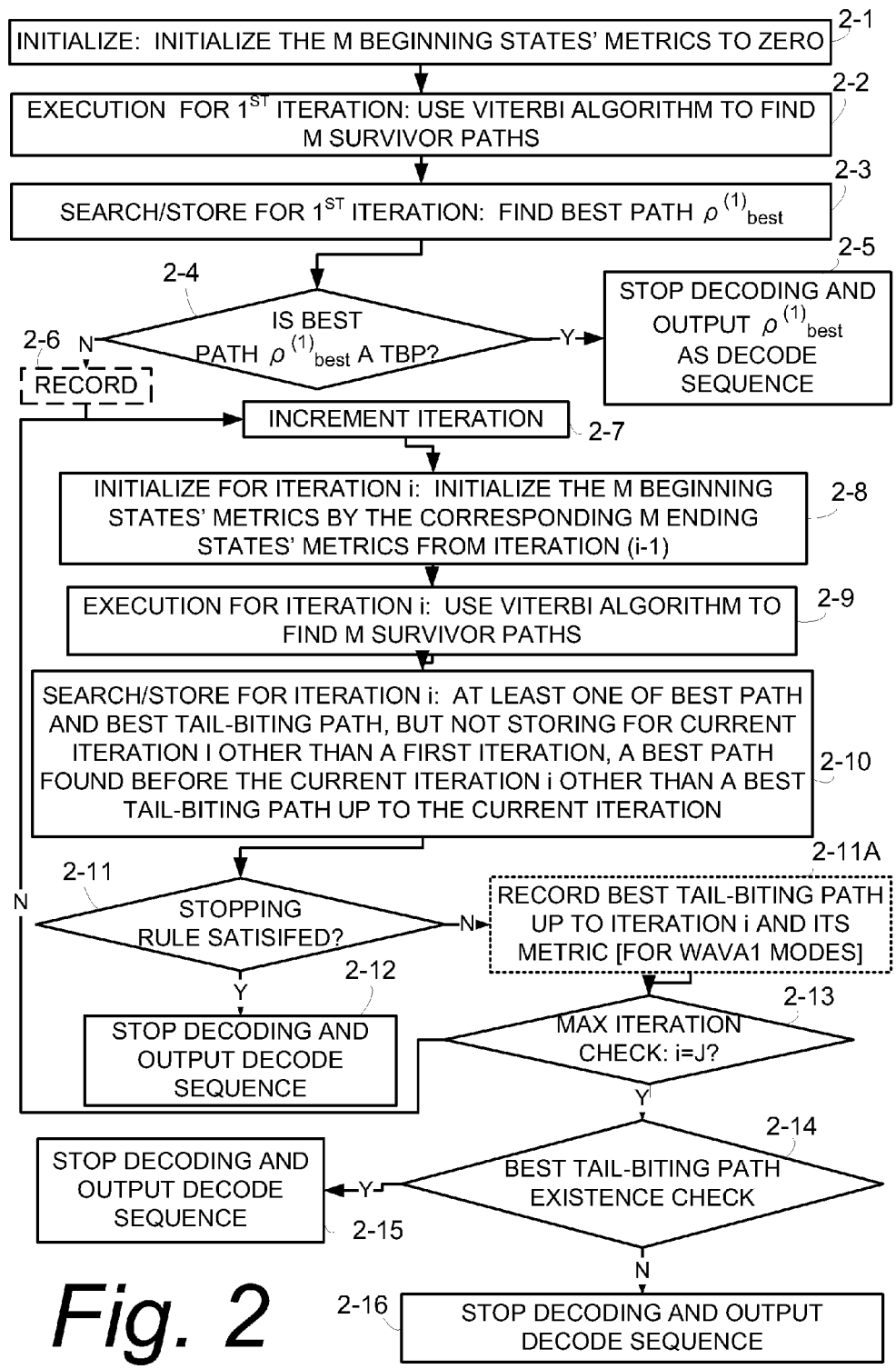
FIG. 2 is a flowchart showing example generic acts or steps performed by the example encoder of FIG. 1 in a generic mode.

Act 2-1 of FIG. 2 comprises initializing all the M beginning states' metrics to zero so that all beginning states are equally likely. Then, as act 2-2, for a first iteration, the conventional Viterbi algorithm is performed to find the M survivor paths at the M ending states. Act 2-3 comprises finding the best path $\rho_{best}^{(1)}$ for the first iteration. If it is determined as act 2-4 that the best path $\rho_{best}^{(1)}$ (the path with the largest path metric) among the M survivor paths is a tail-biting path (TBP), then (as act 2-5) the decoding process is terminated and the decoder outputs the best path $\rho_{best}^{(1)}$ as the decoded sequence. Otherwise, the procedure continues with optional act 2-6 followed by act 2-7.

Optional act 2-6 can involve the decoder 40 storing or recording information of the first iteration, such as $(\rho_{TB,best}^{(1)}, m_{TB,best}^{(1)})$ if the pair exists. As understood with reference to more specific modes, this optional act 2-6 is performed for the modes of WAVA1 simple and WAVA1 sufficient. There is no need to find $(\rho_{TB,best}^{(1)}, m_{TB,best}^{(1)})$ for the modes of WAVA2 simple and WAVA2 sufficient.

Act 2-7 comprises incrementing an iteration counter i. Therefore, for the first execution after the initial iteration, the iteration counter i=1+1=2.

Act 2-8 comprises, for each iteration i (i>1), initializing the state metrics for the M beginning states by the state metrics of the M final states from iteration (i-1). Act 2-9 comprises executing the conventional Viterbi algorithm to find the M survivor paths at the M ending states.

Act 2-10 comprises finding at least one of a best path and a best tail-biting path. In some modes, such as the WAVA1 mode, the best path found by act 2-10 is the best path of iteration i [$\sigma_{best}^{(i)}$] and the best tail-biting path is the best tail-biting path [$\rho_{TB,best}^{(i)}$] Up to iteration i, and ($\rho_{TB,best}^{(i)}$, $m_{TB,best}^{(i)}$) is updated. In some versions of the WAVA1 mode, the best path for the maximum iteration is determined and stored only when the best tail-biting path up to the current iteration does not exist.

In other modes, such as the WAVA2 modes, the best path found by act 2-10 is the best path [$\sigma_{best}^{(i)}$] of iteration i and the best tail-biting path is the best tail-biting path [$\sigma_{TB,best}^{(i)}$] of iteration i. In some versions of the WAVA2 mode, the best path for the current iteration is determined and stored only when the current iteration is a maximum iteration and the best tail-biting path up to the maximum iteration does not exist. Act 2-10 is performed to avoid storing, for a current iteration of the wrap-around Viterbi procedure other than a first iteration, a best path up to the current iteration (e.g., any best path found before the current iteration).

Act 2-11 comprises determining whether the particular stopping rule in effect has been satisfied. As indicated earlier, the stopping rule can be either in accordance with the simple termination condition or the sufficient termination condition, both of which have been earlier described. If the stopping rule has been satisfied, as act 2-12 the decoding is terminated and the decoder 40 outputs an appropriate decoded sequence. As act 2-12, for the WAVA1 modes decoder 40 outputs $\rho_{TB,best}^{(i)}$ as the decoded sequence; for WAVA2 simple decoder 40 outputs $\sigma_{best}^{(i)}$ as the decoded sequence; for WAVA2 sufficient decoder 40 outputs $\sigma_{TB,best}^{(i)}$ as the decoded sequence.

If the stopping rule is not satisfied (as determined by act 2-11), as act 2-11A the best tail-biting path [$\rho_{TB,best}^{(i)}$] up to iteration i and its metric (e.g., $m_{TB,best}^{(i)}$) are recorded for the WAVA1 modes. Since act 2-11A is only performed for the WAVA1 modes, it is shown in broken lines in FIG. 2.

Act 2-13 comprises checking if a maximum number ("J") of iterations have been reached. If not, at least acts 2-7 through 2-11 are executed for a subsequent iteration. If the maximum number of iterations has been reached, act 2-14 is performed.

Act 2-14 is a best tail-biting path existence check. For the modes of WAVA1 simple and WAVA1 sufficient, act 2-14 comprises determining if $\rho_{TB,best}^{(J)}$ exists. For WAVA2 simple and WAVA2 sufficient, act 2-14 comprises determining if $\sigma_{TB,best}^{(J)}$ exists.

If a best tail-biting path does exist, as act 2-15 the decoding terminates and the best tail-biting path is output as the decoded sequence. For the WAVA1 modes, as act 2-15 decoder 40 outputs $\rho_{TB,best}^{(J)}$ as the decoded sequence. For the WAVA2 modes, as act 2-15 decoder 40 outputs $\sigma_{TB,best}^{(J)}$ best as the decoded sequence.

If a best tail-biting path does not exist, as act 2-16 the decoding terminates and the best path is output as the decoded sequence. For the WAVA1 modes and the WAVA2 modes, as act 2-16 decoder 40 outputs $\sigma_{best}^{(J)}$ as the decoded sequence.

Figure 2A:
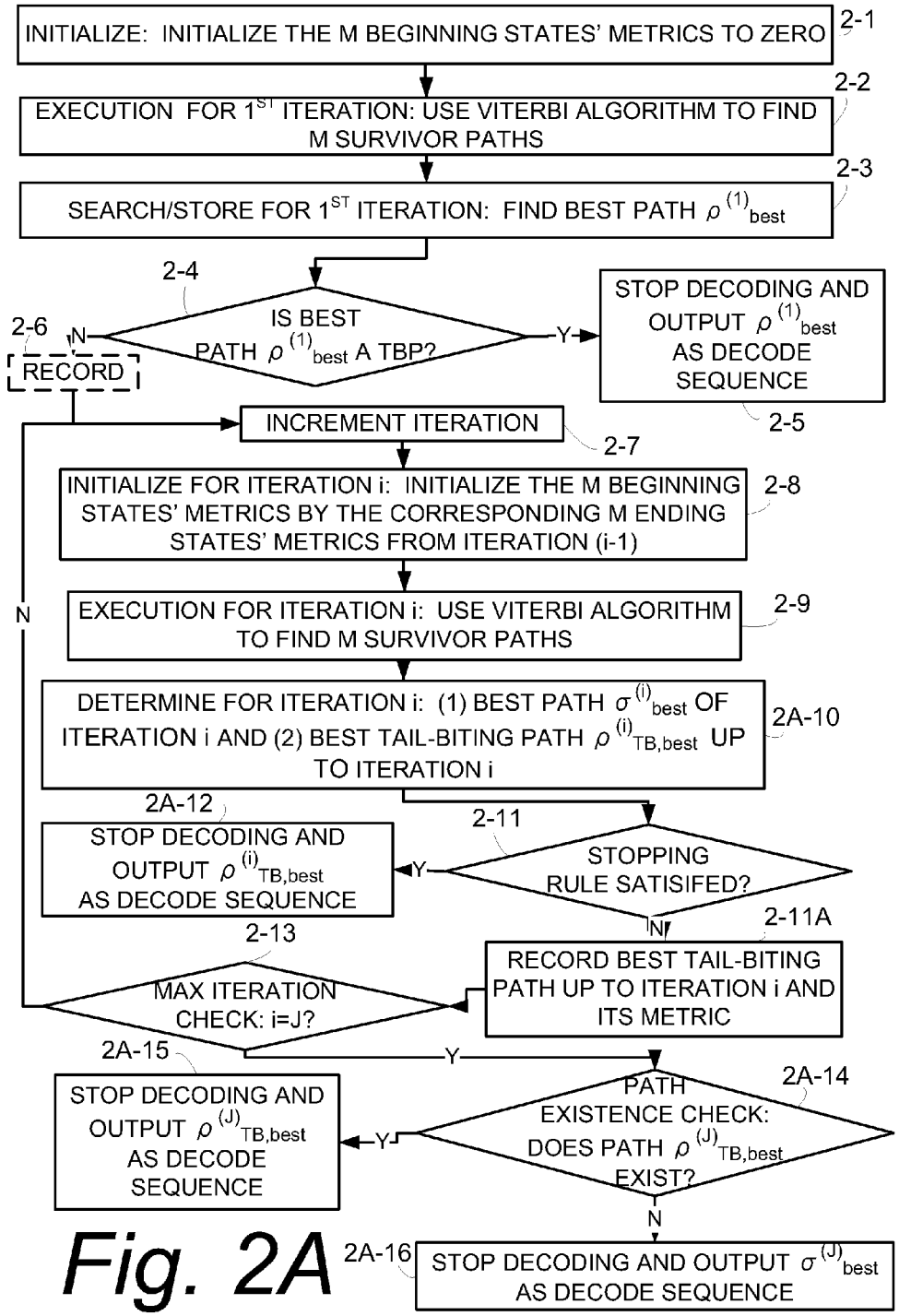
FIG. 2A is a flowchart showing example acts or steps performed by the example encoder of FIG. 1 in a first specific mode.

FIG. 2A shows example acts or steps performed by one specific example embodiment and mode. In the specific example embodiment and mode of FIG. 2A, the decoder/method is configured to determine and store, for the current iteration: (1) a best path for the current iteration; and (2) a best tail-biting path up to the current iteration. The specific example embodiment and mode of FIG. 2A is the WAVA1 simple embodiment/mode.

Acts of the FIG. 2A embodiment/mode which are essentially identical to those of the generic FIG. 2 embodiment/mode have corresponding reference numerals. Acts of the FIG. 2A embodiment/mode which are elaborated in FIG. 2A bear a prefix of 2A for the act number, and include act 2A-10, act 2A-12, and act 2A-14 through and including act 2A-16.

Act 2A-10 comprises determining and storing, for the current iteration: (1) a best path [$\sigma_{best}^{(i)}$] of the current iteration; and (2) a best tail-biting path [$\rho_{TB,best}^{(i)}$] up to the current iteration.

For act 2A-12 the outputted path is the best tail-biting path [$\rho_{TB,best}^{(i)}$] up to iteration i.

Act 2A-14 comprises determining if a best tail-biting path up to the maximum iteration [$\rho_{TB,best}^{(J)}$] exists.

Act 2A-15 comprises outputting the best tail-biting path up to the maximum iteration [$\rho_{TB,best}^{(J)}$] if the determination of act 2A-14 is positive, and act 2A-16 comprises outputting the best path for the maximum iteration [$\sigma_{best}^{(J)}$] if the determination of act 2A-14 is negative.

Figure 2B:
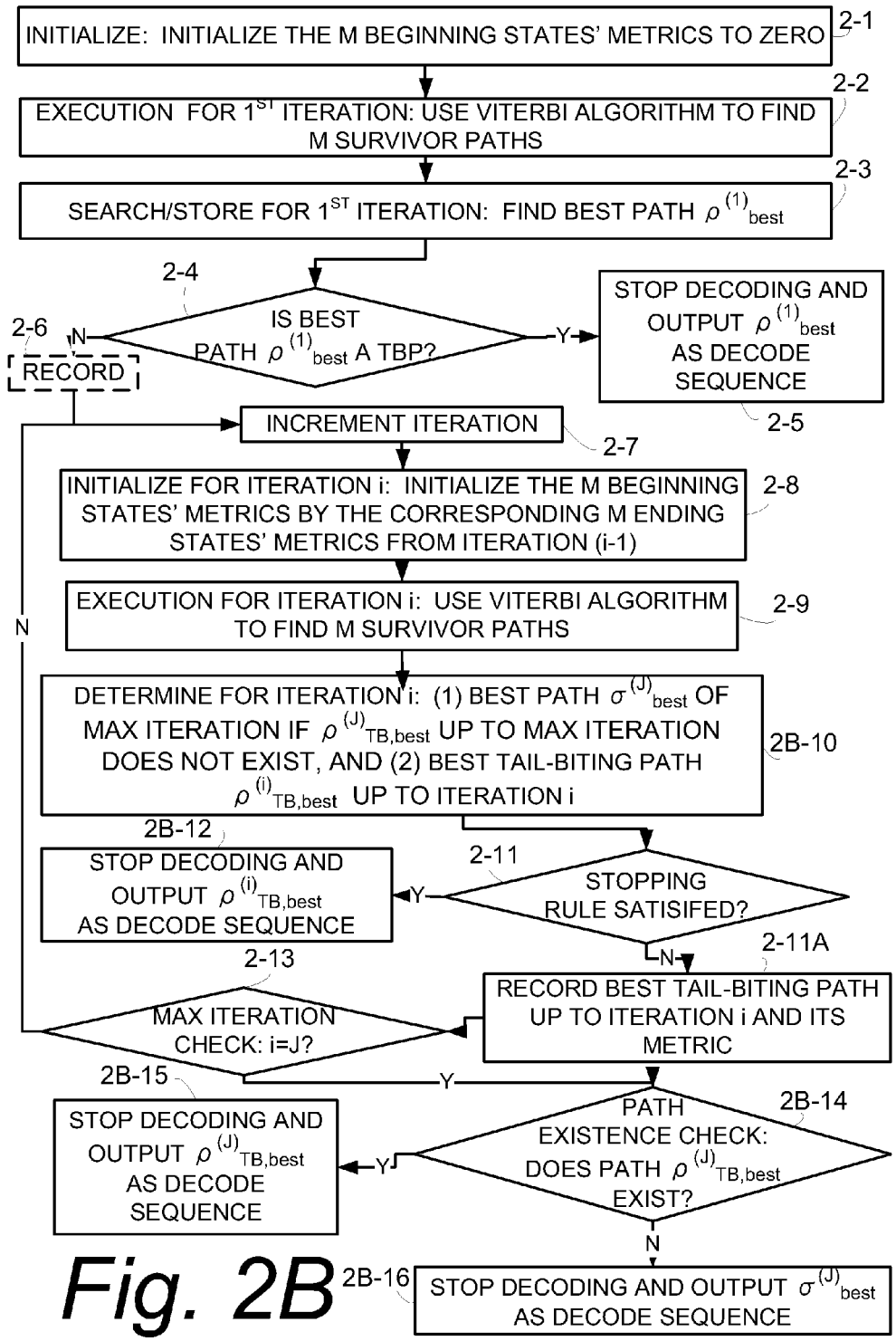
FIG. 2B is a flowchart showing example acts or steps performed by the example encoder of FIG. 1 in a second specific mode.

FIG. 2B shows example acts or steps performed by one specific example embodiment and mode. In the specific example embodiment and mode of FIG. 2B, the decoder/method is configured, for the current iteration: (1) to determine a best path for the current iteration when the current iteration is a maximum iteration and only when the best tail-biting path up to the maximum iteration does not exist; and (2) to determine and record a best tail-biting path up to the current iteration. The specific example embodiment and mode of FIG. 2B is the WAVA1 sufficient embodiment/mode.

Acts of the FIG. 2B embodiment/mode which are essentially identical to those of the generic FIG. 2 embodiment/mode have corresponding reference numerals. Acts of the FIG. 2B embodiment/mode which are elaborated in FIG. 2B bear a prefix of 2B for the act number, and include act 2B-10, act 2B-12, and act 2B-14 through and including act 2B-16.

Act 2B-10 comprises, for the current iteration: (1) determining a best path $[\sigma_{best}^{(i)}]$ of the current iteration when the current iteration is the maximum iteration and only when the best tail-biting path $[\rho_{TB,best}^{(i)}]$ up to the maximum iteration does not exist; or (2) determining and recording a best tail-biting path $[\rho_{TB,best}^{(i)}]$ up to the current iteration.

For act 2B-12 the outputted path is the best tail-biting path $[\rho_{TB,best}^{(i)}]$ up to iteration i.

Act 2B-14 comprises determining if a best tail-biting path up to the maximum iteration $[\rho_{TB,best}^{(J)}]$ exists.

Act 2B-15 comprises outputting the best tail-biting path up to the maximum iteration $[\rho_{TB,best}^{(J)}]$ if the determination of act 2B-14 is positive, and act 2B-16 comprises outputting the best path for the maximum iteration $[\sigma_{best}^{(J)}]$ if the determination of act 2B-14 is negative.

Figure 2C:
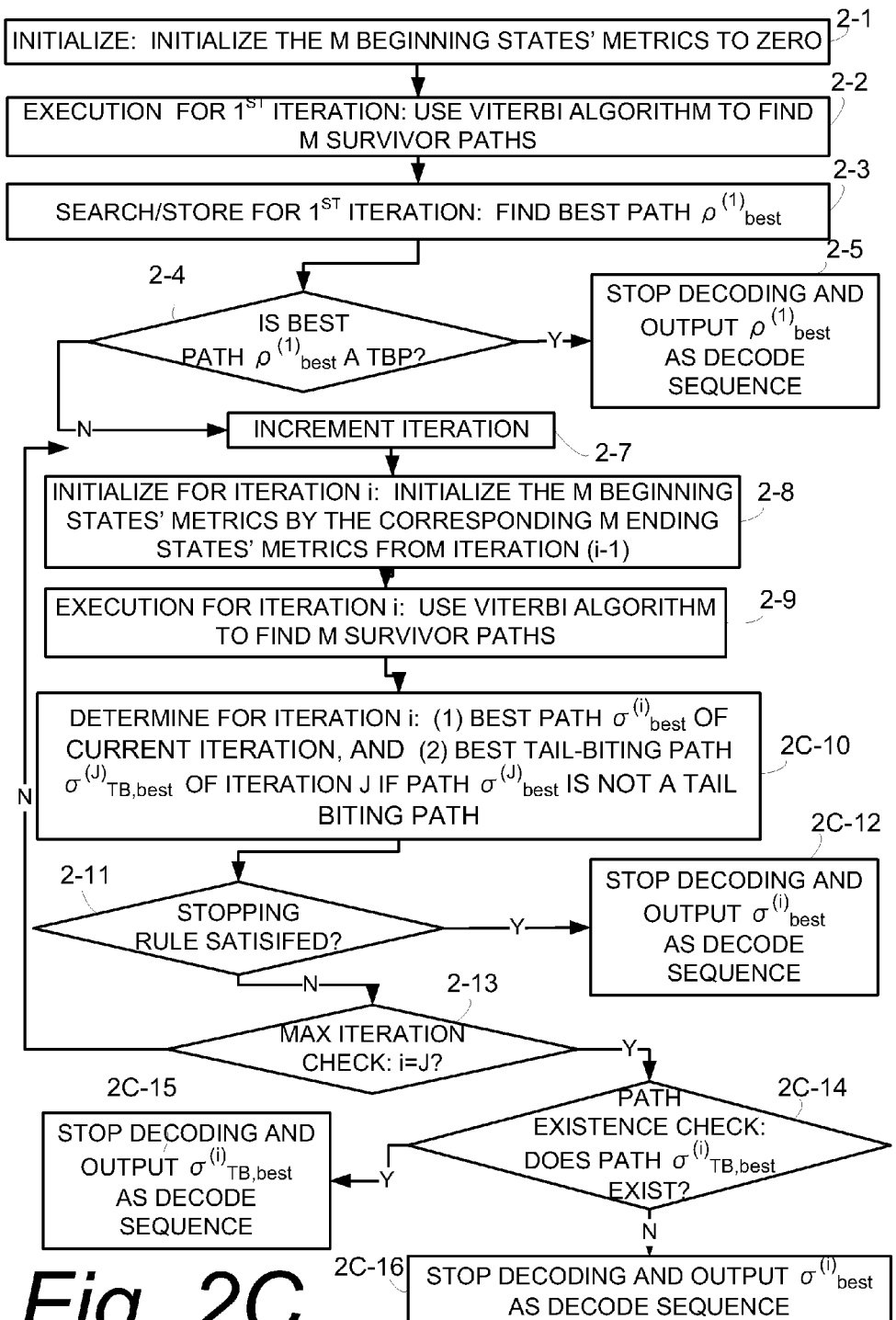
FIG. 2C is a flowchart showing example acts or steps performed by the example encoder of FIG. 1 in a third specific mode.

FIG. 2C shows example acts or steps performed by another specific example embodiment and mode. In the specific example embodiment and mode of FIG. 2C, the decoder/method is configured to determine, for the current iteration, a best path for the current iteration $[\sigma_{best}^{(i)}]$, and a best tail-biting path only when the current iteration is the maximum iteration and when $\sigma_{best}^{(J)}$ is not a tail biting path $[\sigma_{TB,best}^{(J)}]$. The specific example embodiment and mode of FIG. 2C is the WAVA2 simple embodiment/mode. Acts of the FIG. 2C embodiment/mode which are essentially identical to those of the generic FIG. 2 embodiment/mode have corresponding reference numerals. Acts of the FIG. 2C embodiment/mode which are elaborated in FIG. 2C bear a prefix of 2C for the act number, and include act 2C-10, act 2C-12, and act 2C-14 through and including act 2C-16.

Act 2C-10 comprises determining, for the current iteration: (1) a best path for the current iteration $[\sigma_{best}^{(i)}]$; and (2) a best tail-biting path for the current iteration $[\sigma_{TB,best}^{(i)}]$ when the current iteration is a maximum iteration and only when $\sigma_{best}^{(J)}$ is not a tail biting path (TBP) upon completion of a maximum iteration (e.g., last iteration).

For act 2C-12 the outputted path is the best path during iteration i $[\sigma_{best}^{(i)}]$.

Act 2C-14 comprises determining if a best tail-biting path for the maximum iteration $[\sigma_{TB,best}^{(J)}]$ exists.

Act 2C-15 comprises outputting the best tail-biting path for the maximum iteration $[\sigma_{TB,best}^{(J)}]$ if the determination of act 2C-14 is positive; and act 2C-16 comprises outputting the best path for the maximum iteration $[\sigma_{best}^{(J)}]$ if the determination of act 2C-14 is negative.

Figure 2D:
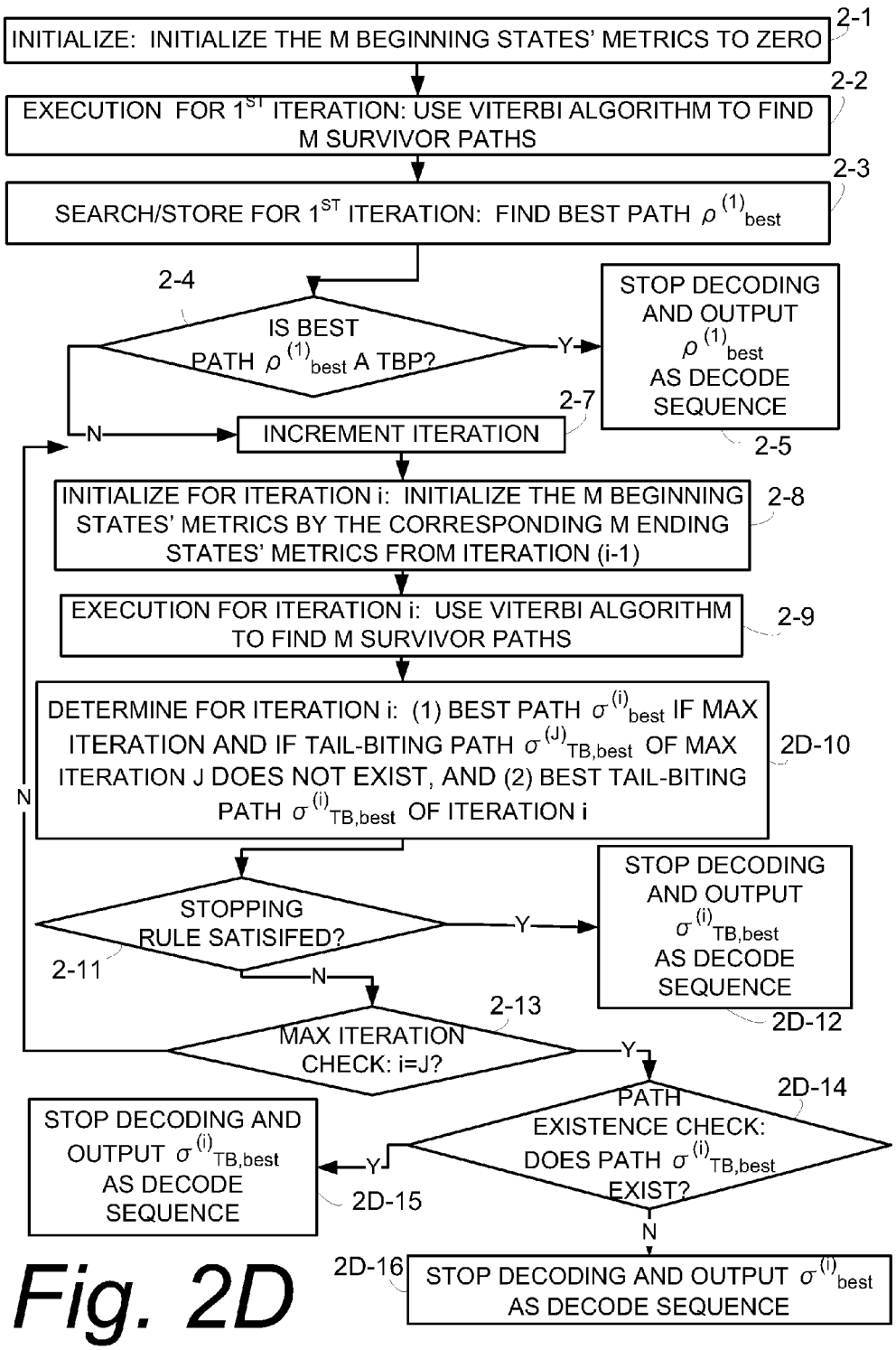
FIG. 2D is a flowchart showing example acts or steps performed by the example encoder of FIG. 1 in a fourth specific mode.

FIG. 2D shows example acts or steps performed by yet another specific example embodiment and mode. In the specific example embodiment and mode of FIG. 2D, the decoder/method is configured to determine and store, for the current iteration: (1) a best path for the current iteration $[\sigma_{best}^{(i)}]$ when the current iteration is the maximum iteration and only when the best tail-biting path for the maximum iteration $[\sigma_{TB,best}^{(i)}]$ does not exist; or (2) a best tail-biting path for the current iteration $[\sigma_{TB,best}^{(i)}]$. The specific example embodiment and mode of FIG. 2D is the WAVA2 sufficient embodiment/mode. Acts of the FIG. 2D embodiment/mode which are essentially identical to those of the generic FIG. 2 embodiment/mode have corresponding reference numerals. Acts of the FIG. 2D embodiment/mode which are elaborated in FIG. 2D bear a prefix of 2D for the act number, and include act 2D-10, act 2D-12, and act 2D-14 through and including act 2D-16.

Act 2D-10 comprises determining and storing, for the current iteration: (1) a best path for the current iteration $[_{best}^{(i)}]$ when the current iteration is the maximum iteration and only when the best tail-biting path for the maximum iteration $[\sigma_{TB,best}^{(i)}]$ does not exist; or (2) a best tail-biting path for the current iteration $[\sigma_{TB,best}^{(i)}]$.

For act 2D-12 the outputted path is the best tail-biting path for iteration i, i.e., $\sigma_{TB,best}^{(i)}$.

Act 2D-14 comprises determining if a best tail-biting path for the maximum iteration $[\sigma_{TB,best}^{(J)}]$ exists.

Act 2D-15 comprises outputting the best tail-biting path for the maximum iteration $[\sigma_{TB,best}^{(J)}]$ if the determination of act 2D-14 is positive; and act 2D-16 comprises outputting the best path for the maximum iteration $[\sigma_{best}^{(J)}]$ if the determination of act 2D-14 is negative.

It will be appreciated that decoder 40 can take the form of a processor or controller as those terms are expansively defined herein, and that the processor or controller can either be dedicated to decoder 40 or shared by decoder 40 with other functionalities of the node or device 20. Moreover, in some example embodiments the decoding function of 40 can be realized by plural processors or controllers, e.g. distributed over plural processors or controllers.

Comparisons of existing (conventional) WAVA algorithms and the algorithms proposed herein such as the four described above are summarized in Table 1. In Table 1, Algorithm ("Alg.") 1 is the baseline or conventional algorithm with simple termination condition, and should be compared with algorithm Alg. 2 and algorithm Alg. 3 since algorithm Alg. 2 and algorithm Alg. 3 represent example embodiments/modes of the technology described herein. Likewise, algorithm Alg. 4 is the baseline or conventional algorithm with sufficient termination condition, and thus algorithm Alg. 4 should be compared against algorithm Alg. 5 and algorithm Alg. 6, since algorithm Alg. 5 and algorithm Alg. 6 represent example embodiments/modes of the technology described herein.

The advantages of the technology are several. Link-level simulations are performed to show the advantages of the proposed algorithm, where the 802.16 rate ½ TBCC with payload size 24 bits (called the short-length code) or 240 bits (called the long-length code) is used. The generator polynomials in octal form for the TBCC are given by (554, 744) and the memory length is v=6. The maximum number of cycles (or iterations) allowed in decoding is I=30 for payload size 24 bits and is I=20 for payload size 240 bits. The number of simulation trials is 2000000 per SNR point. The advantages of the technology are summarized in Table 1, and are described as follows:

1. Both WAVA1 and WAVA2 require less computational complexity and memory usage than those for WAVA during each decoding iteration, with simple or sufficient termination condition. For WAVA, the best path and the best TBP up to the current iteration need to be found and recorded. For WAVA1 simple, the best path for the current iteration is needed, and there is no need to find the best path up to the current iteration. Nevertheless, the best TBP up to the current iteration still needs to be found and recorded for WAVA1 simple. For WAVA1 sufficient, the best TBP up to the current iteration needs to be found and recorded. The best path for the current iteration is needed only at the maximum iteration J when the best TBP up to the maximum iteration J does not exist. For WAVA2 sufficient, the best TBP and the best path (needed only when the best TBP does not exist at maximum iteration J) for the current iteration are needed, but there is no need to find the best path and the best TBP up to the current iteration. For WAVA2 simple, the best path and the best TBP (needed only when the best path is not a TBP at iteration J) for the current iteration are needed, but there is no need to find the best path and the best TBP up to the current iteration. Therefore, among the proposed algorithms, WAVA2 requires less computational complexity and memory usage than those for WAVA1.

Figure 3:
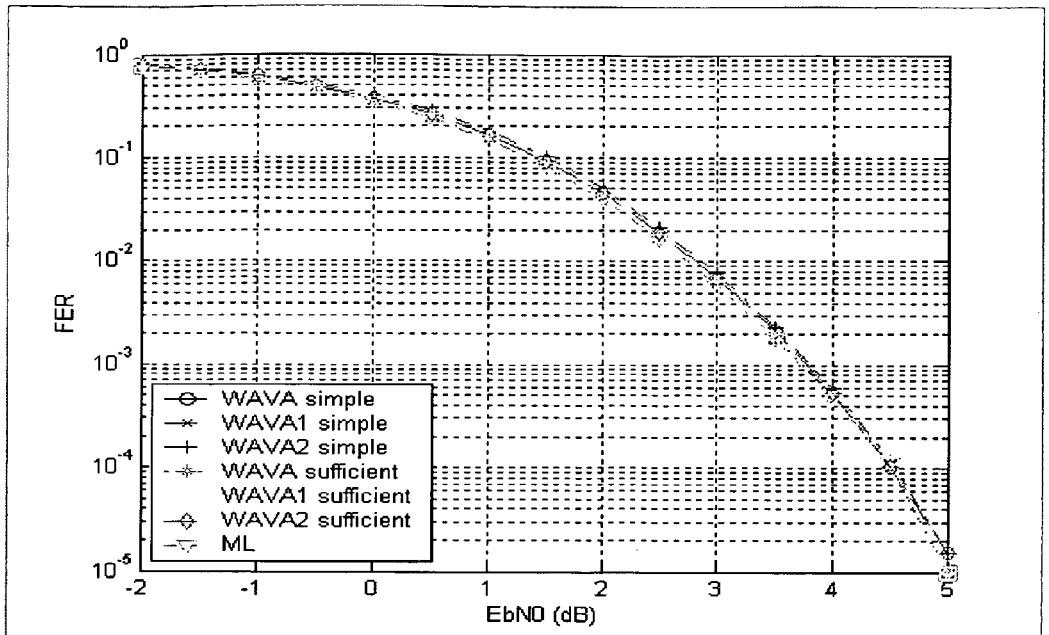
FIG. 3 is a graph showing comparisons of FER for length-24 rate ½ Tail-biting convolutional code (TBCC).
Figure 4:
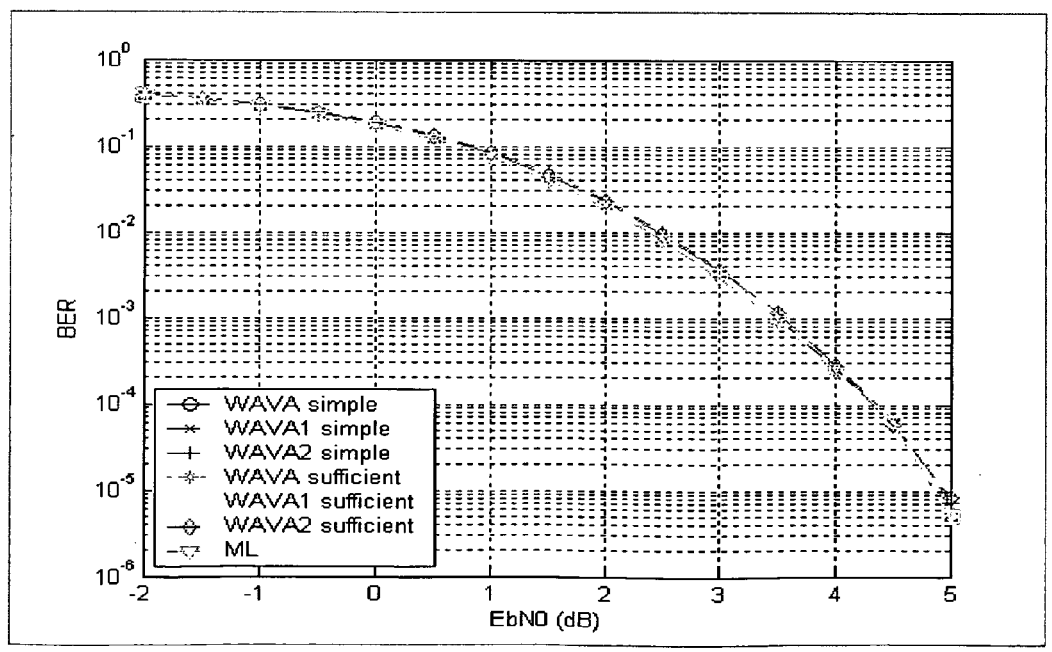
FIG. 4 is a graph showing comparisons of BER for length-24 rate ½ Tail-biting convolutional code (TBCC).
Figure 6:
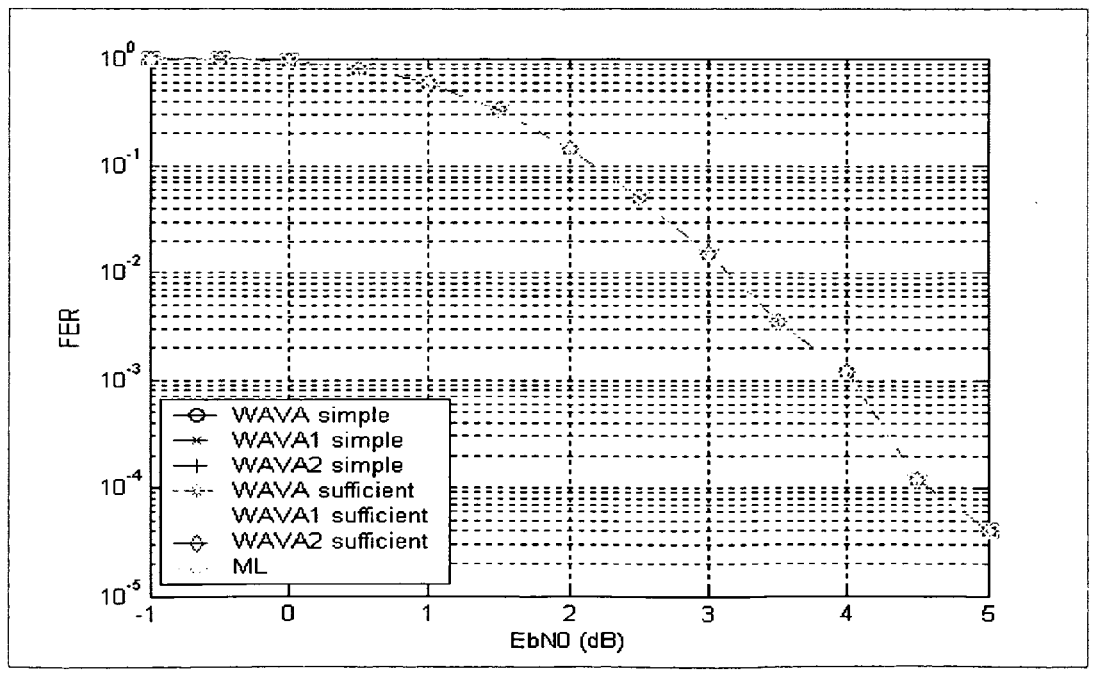
FIG. 6 is a graph showing comparisons of FER for length-240 rate ½ Tail-biting convolutional code (TBCC).
Figure 7:
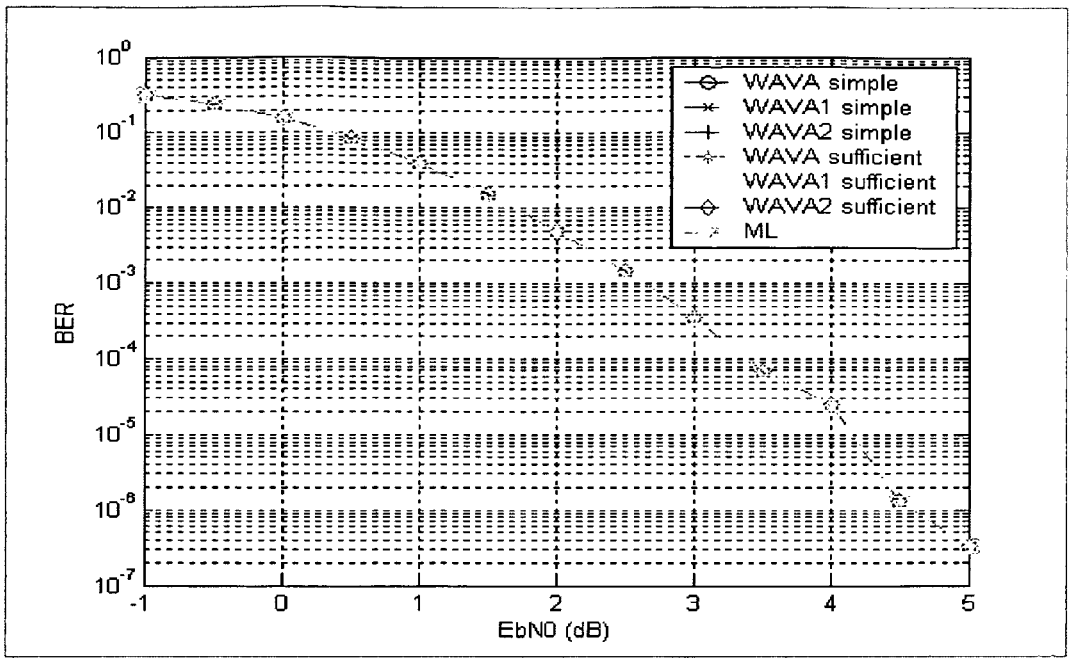
FIG. 7 is a graph showing comparisons of BER for length-240 rate ½ Tail-biting convolutional code (TBCC).

2. The performances of both WAVA1 and WAVA2 are almost identical to those of WAVA, either with the simple or the sufficient termination condition. For WAVA1 simple and WAVA1 sufficient, from FIG. 3 and FIG. 4 it is seen that there is almost no loss in FER and BER from WAVA for the short-length code (payload 24 bits). For WAVA2 simple and WAVA2 sufficient, from FIG. 3 and FIG. 4 it is seen that there is a loss of 0.1 dB or less in FER and BER compared with WAVA for the short-length code. For the long-length code (payload 240 bits), from FIG. 6 and FIG. 7 it is seen that the performances of both WAVA1 and WAVA2 are identical to those of WAVA, either with the simple or the sufficient termination condition.

Figure 5:
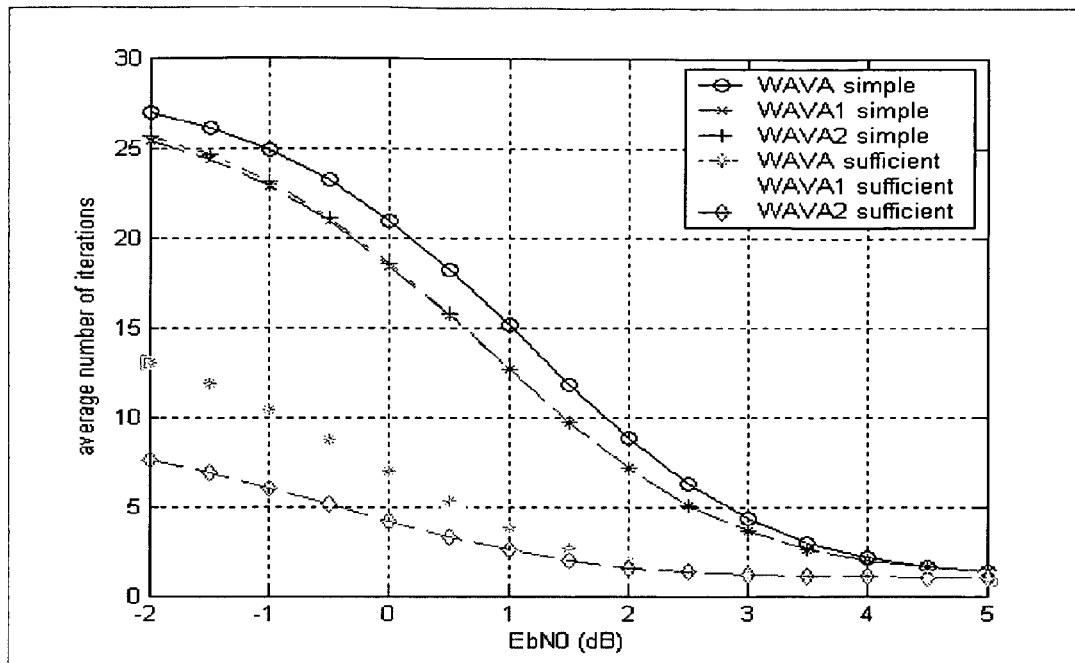
FIG. 5 is a graph showing comparisons of average number of iterations needed for length-24 rate ½ Tail-biting convolutional code (TBCC).
Figure 8:
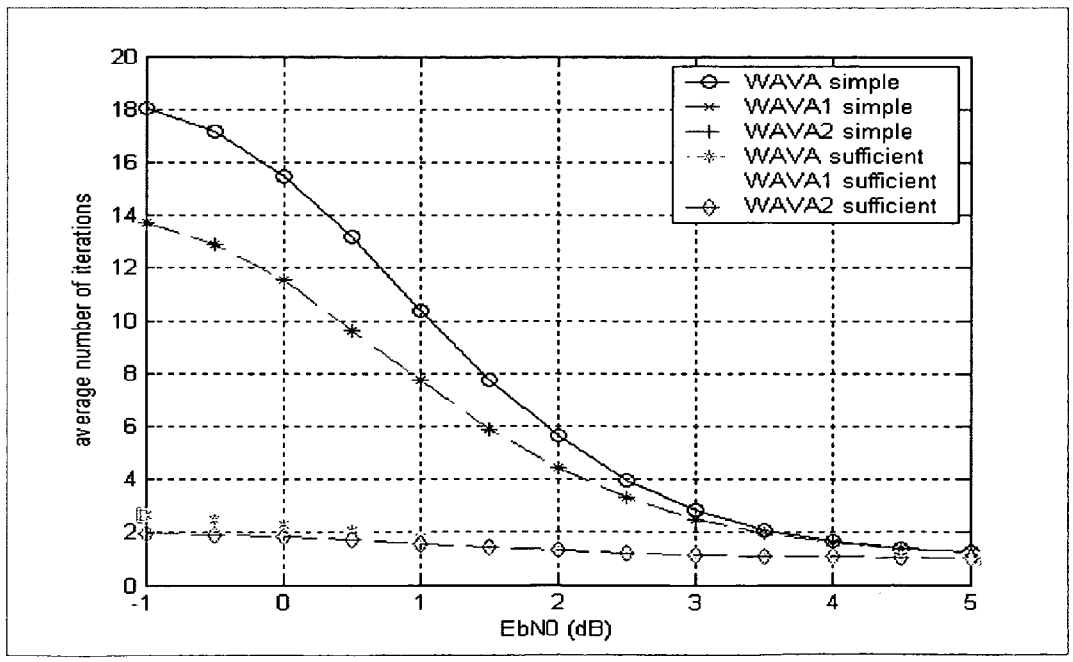
FIG. 8 is a graph showing comparisons of average number of iterations needed for length-240 rate ½ Tail-biting convolutional code (TBCC).

Both WAVA1 simple and WAVA2 simple require less number of decoding iterations than WAVA simple. WAVA2 sufficient requires less number of decoding iterations than WAVA sufficient, while WAVA1 sufficient requires the same number of decoding iterations as WAVA sufficient. The conclusion holds for both the short-length code and the long-length code, and are shown in FIG. 5 and FIG. 8.

Although the description above contains many specificities, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art. All structural, chemical, and functional equivalents to the elements of the above-described preferred embodiment that are known to those of ordinary skill in the art are expressly incorporated herein by reference. Moreover, it is not necessary for a device or method to address each and every problem sought to be solved by the present invention for it to be encompassed hereby.

TABLE 1

Comparison of Algorithms

| Algorithms and Stopping Rule | Update of the best path | Update of the best tail-biting path | Comparison on the number of iterations | Comparison on FER/BER |
|---|---|---|---|---|
| Alg. 1: WAVA Simple | Best from all iterations (needs to be recorded) | best from all iterations (needs to be recorded) | baseline with simple termination condition | baseline with simple termination condition |
| Alg. 2: WAVA1 Simple | Best from current iteration | best from all iterations (needs to be recorded) | less than Alg. 1 for both the short-length and long-length codes | approximately the same as Alg. 1 for both the short-length and long-length codes |
| Alg. 3: WAVA2 Simple | Best from current iteration | best from current iteration | less than Alg. 1 for both the short-length and long-length codes | for the short-length code, less than 0.1 dB loss from Alg. 1; for the long-length code, approximately the same as Alg. 1 |
| Alg. 4: WAVA Sufficient | Best from all iterations (needs to be recorded) | best from all iterations (needs to be recorded) | baseline with sufficient termination condition | Baseline with sufficient termination condition |
| Alg. 5: WAVA1 Sufficient | Best from current iteration | best from all iterations (needs to be recorded) | same as Alg. 4 for both the short-length and long-length codes | approximately the same in FER/BER as Alg. 4 for both the short-length and long-length codes |
| Alg. 6: WAVA2 Sufficient | Best from current iteration | best from current iteration | less than Alg. 4 for both the short-length and long-length codes | for the short-length code, less than 0.1 dB loss from Alg. 4; for the long-length code, approximately the same as Alg. 4 |

TABLE 2

| Abbreviations | |
|---|---|
| BCJR | Bahl-Cocke-Jelinek-Raviv |
| CC | Convolutional Code |
| FEC | Forward Error Correction |
| MAP | Maximum a Posteriori Probability |
| ML | Maximum Likelihood |
| SNR | Signal to Noise Ratio |
| TBCC | Tail-Biting Convolutional Code |
| TBP | Tail-Biting Path |
| WAVA | Wrap-Around Viterbi Algorithm |
| WAVA1 | first reduced-complexity Wrap-Around Viterbi Algorithm |
| WAVA1 simple | WAVA1 with simple termination condition |
| WAVA1 sufficient | WAVA1 with sufficient termination condition |
| WAVA2 | second reduced-complexity Wrap-Around Viterbi Algorithm |
| WAVA2 simple | WAVA2 with simple termination condition |

TABLE 2-continued

| Abbreviations | |
|---|---|
| WAVA2 sufficient | WAVA2 with sufficient termination condition |
| WiMAX | Worldwide Interoperability for Microwave Access |
| ZTCC | Zero-Tail Convolutional Code |

What is claimed is:

1. A decoder configured to operate upon an input encoded sequence using a wrap around Viterbi procedure, the decoder being configured to output a selected path as a decode sequence, and wherein the decoder is configured not to store, for a current iteration of the wrap-around Viterbi procedure other than a first iteration, a best path found before the current, iteration other than a best tail-biting path up to the current iteration.

2. The decoder of claim 1, wherein the decoder is configured, for the current iteration: (1) to determine a best path for the current iteration; and (2) to determine and to record the best tail-biting path up to the current iteration.

3. The decoder of claim 1; wherein the decoder is configured, for the current iteration: (1) to determine a best path for the current iteration when the current iteration is a maximum iteration and only when a best tail-biting path up to the maximum iteration does not exist; and (2) to determine and to record the best tail-biting path up to the current iteration.

4. The decoder of claim 1, wherein the decoder is configured to determine, for the current iteration: (1) a best path for the current iteration when the current iteration is a maximum iteration and only when a best tail-biting path for the maximum iteration does not exist; and (2) a best tail-biting path for the current iteration.

5. The decoder of claim 1, wherein the decoder is configured to determine, for the current iteration: (1) a best path for the current iteration, and (2) a best tail-biting path for the current iteration when the current iteration is a maximum iteration and only when a best path for the maximum iteration is not a tail biting path.

6. A method of performing a decoding operation comprising:
using a wrap around Viterbi procedure to operate upon an input encoded sequence by performing iterations of the Viterbi procedure;
for current iteration of the wrap-around Viterbi procedure other than a first iteration, finding and storing a best path and/or a best tail-biting path without storing during the current iteration a best path other than a best tail-biting path found before the current iteration.

7. The method of claim 6, further comprising:
(1) for a first iteration of the Viterbi procedure:
  (1.1) initializing M number of beginning states;
  (1.2) executing the Viterbi procedure and finding M number of survivor paths;
  (1.3) finding the best path for the first iteration;
  (1.4) determining if the best path for the first iteration is a tail biting path, and if so decoding and outputting the best path for the first iteration as the decoded sequence;
(2) incrementing an iteration counter, and for a current iteration i corresponding to the iteration counter:
  (2.1) initializing M number of beginning states' metrics by corresponding M ending states' metrics from iteration i-1;
  (2.2) executing the Viterbi procedure and finding M number of survivor paths;
  (2.3) performing a search and/or store operation for iteration i without storing for iteration i, a best path up to the current iteration i;
  (2.4) determining if a stopping rule is satisfied, and if so outputting a path as the decoded sequence;
  (2.5) determining if a maximum number of iterations have been performed, and if not returning to act (2);
(3) performing a path existence check; and,
(4) outputting a path as the decoded sequence.

8. The method of claim 7, wherein:
act (2.3) comprises, for the current iteration: (1) determining a best path for the current iteration; and (2) determining and recording a best tail-biting path up to the current iteration;
for act (2.4) the outputted path is the best tail-biting path up to iteration i;
act (3) comprises determining if a best tail-biting path up to the maximum iteration exists;
act (4) comprises outputting the best tail-biting path up to the maximum iteration if the determination of act (3) is positive; and
act (4) comprises outputting the best path for the maximum iteration if the determination of act (3) is negative.

9. The method of claim 7, wherein:
act (2.3) comprises, for the current iteration: (1) determining a best path for the current iteration when the current iteration is a maximum iteration and only when the best tail biting path up to the maximum iteration does not exist; and (2) determining and recording a best tail-biting path up to the current iteration;
for act (2.4) the outputted path is the best tail-biting path up to iteration i;
act (3) comprises determining if a best tail-biting path up to the maximum iteration exists;
act (4) comprises outputting the best tail-biting path up to the maximum iteration if the determination of act (3) is positive; and
act (4) comprises outputting the best path for the maximum iteration if the determination of act (3) is negative.

10. The method of claim 7, wherein:
act (2.3) comprises determining, for the current iteration: (1) a best path for the current iteration when the current iteration is a maximum iteration and only when a best tail-biting path for the current iteration does not exist; and (2) a best tail-biting path for the current iteration;
for act (2.4) the outputted path is the best tail-biting path for iteration i;
act (3) comprises determining if a best tail-biting path exists for the maximum iteration;
act (4) comprises outputting the best tail-biting path for the maximum iteration if the determination of act (3) is positive; and
act (4) comprises outputting the best path for the maximum iteration if the determination of act (3) is negative.

11. The method of claim 7, wherein:
act (2.3) comprises determining, for the current iteration: (1) a best path for the current iteration, and (2) a best tail-biting path for the current iteration when the current iteration is a maximum iteration and when the best path of the maximum iteration is not a tail biting path;
for act (2.4) the outputted path is the best path during iteration i;
act (3) comprises determining if a best tail-biting path exists for the maximum iteration;
act (4) comprises outputting the best tail-biting path for the maximum iteration if the determination of act (3) is positive; and act (4) comprises outputting the best path for the maximum iteration if the determination of act (3) is negative.

12. A method of performing a decoding operation comprising:
   using a wrap around Viterbi procedure to operate upon an input encoded sequence by performing iterations of the Viterbi procedure;
   for a current iteration of the wrap-around Viterbi procedure:
      finding a best path of the current iteration; and/or
      finding a best tail-biting path of the current iteration; and/or
      finding and storing a best tail-biting path up to the current iteration;
   without storing during the current iteration a best path other than a best tail-biting path found up to the current iteration.

13. The method of claim 12, further comprising:
   (1) for a first iteration of the Viterbi procedure:
      (1.1) initializing M number of beginning states;
      (1.2) executing the Viterbi procedure and finding M number of survivor paths;
      (1.3) finding the best path for the first iteration;
      (1.4) determining if the best path for the first iteration is a tail biting path, and if so decoding and outputting the best path for the first iteration as the decoded sequence;
   (2) incrementing an iteration counter, and for a current iteration i corresponding to the iteration counter:
      (2.1) initializing M number of beginning states' metrics by corresponding M ending states' metrics from iteration i-1;
      (2.2) executing the Viterbi procedure and finding M number of survivor paths;
      (2.3) performing a search and/or store operation for iteration i without storing for iteration i, a best path up to the current iteration i;
      (2.4) determining if a stopping rule is satisfied, and if so outputting a path as the decoded sequence;
      (2.5) determining if a maximum number of iterations have been performed, and if not returning to act (2);
   (3) performing a path existence check; and,
   (4) outputting a path as the decoded sequence.

14. The method of claim 7, wherein:
   act (2.3) comprises, for the current iteration: (1) determining a best path for the current iteration; and (2) determining and recording a best tail-biting path up to the current iteration;
   for act (2.4) the outputted path is the best tail-biting path up to iteration i;
   act (3) comprises determining if a best tail-biting path up to the maximum iteration exists;
   act (4) comprises outputting the best tail-biting path up to the maximum iteration if the determination of act (3) is positive; and
   act (4) comprises outputting the best path for the maximum iteration if the determination of act (3) is negative.

15. The method of claim 13, wherein:
   act (2.3) comprises, for the current iteration: (1) determining a best path for the current iteration when the current iteration is a maximum iteration and only when the best tail biting path up to the maximum iteration does not exist; and (2) determining and recording a best tail-biting path up to the current iteration;
   for act (2.4) the outputted path is the best tail-biting path up to iteration i;
   act (3) comprises determining if a best tail-biting path up to the maximum iteration exists;
   act (4) comprises outputting the best tail-biting path up to the maximum iteration if the determination of act (3) is positive; and
   act (4) comprises outputting the best path for the maximum iteration if the determination of act (3) is negative.

16. The method of claim 13, wherein:
   act (2.3) comprises determining, for the current iteration: (1) a best path for the current iteration when the current iteration is a maximum iteration and only when a best tail-biting path for the current iteration does not exist; and (2) a best tail-biting path for the current iteration;
   for act (2.4) the outputted path is the best tail-biting path for iteration i;
   act (3) comprises determining if a best tail-biting path exists for the maximum iteration;
   act (4) comprises outputting the best tail-biting path for the maximum iteration if the determination of act (3) is positive; and
   act (4) comprises outputting the best path for the maximum iteration if the determination of act (3) is negative.

17. The method of claim 13, wherein:
   act (2.3) comprises determining, for the current iteration: (1) a best path for the current iteration, and (2) a best tail-biting path for the current iteration when the current iteration is a maximum iteration and when the best path of the maximum iteration is not a tail biting path;
   for act (2.4) the outputted path is the best path during iteration i;
   act (3) comprises determining if a best tail-biting path exists for the maximum iteration;
   act (4) comprises outputting the best tail-biting path for the maximum iteration if the determination of act (3) is positive; and
   act (4) comprises outputting the best path for the maximum iteration if the determination of act (3) is negative.

* * * * *

UNITED STATES PATENT AND TRADEMARK OFFICE
CERTIFICATE OF CORRECTION

PATENT NO. : 8,219,896 B2  
APPLICATION NO. : 12/140956  
DATED : July 10, 2012  
INVENTOR(S) : Chen et al.

Page 1 of 2

It is certified that error appears in the above-identified patent and that said Letters Patent is hereby corrected as shown below:

In the Drawings:

In Fig. 2, Sheet 2 of 9, for Tag "2-11", in Line 2, delete "SATISIFED?" and insert -- SATISFIED? --, therefor.

In Fig. 2A, Sheet 3 of 9, for Tag "2-11", in Line 2, delete "SATISIFED?" and insert -- SATISFIED? --, therefor.

In Fig. 2B, Sheet 4 of 9, for Tag "2-11", in Line 2, delete "SATISIFED?" and insert -- SATISFIED? --, therefor.

In Fig. 2C, Sheet 5 of 9, for Tag "2-11", in Line 2, delete "SATISIFED?" and insert -- SATISFIED? --, therefor.

In Fig. 2D, Sheet 6 of 9, for Tag "2-11", in Line 2, delete "SATISIFED?" and insert -- SATISFIED? --, therefor.

In the Specifications:

In Column 4, Line 3, delete "tail-biting" and insert -- tail-biting path --, therefor.

In Column 4, Line 7, delete "$\sigma_{TB,best}^{(1)}$" and insert -- $\sigma_{TB,best}^{(i)}$ --, therefor.

In Column 4, Line 62, delete "reference)." and insert -- reference. --, therefor.

In Column 12, Line 11, delete "$[_{best}^{(i)}]$" and insert -- $[\sigma_{best}^{(i)}]$ --, therefor.

In the Claims:

Signed and Sealed this  
Thirtieth Day of April, 2013

Teresa Stanek Rea  
*Acting Director of the United States Patent and Trademark Office*

In Column 15, Line 16, in Claim 1, delete "current," and insert -- current --, therefor.

In Column 15, Line 23, in Claim 3, delete "claim 1;" and insert -- claim 1, --, therefor.

In Column 15, Line 46, in Claim 6, delete "for current" and insert -- for a current --, therefor.